United States Patent [19]
Elzer et al.

[11] Patent Number: 4,842,987
[45] Date of Patent: Jun. 27, 1989

[54] PHOTOSENSITIVE ELEMENT FOR PRODUCING PRINTING PLATES OR RESIST IMAGES

[75] Inventors: Albert Elzer, Otterstadt; Axel Sanner, Frankenthal; Hans Schupp, Worms; Erich Beck, Mannheim, all of Fed. Rep. of Germany

[73] Assignee: BASF Aktiengesellschaft, Ludwigshafen, Fed. Rep. of Germany

[21] Appl. No.: 62,162

[22] Filed: Jun. 15, 1987

[51] Int. Cl.$^4$ .............................................. G03B 1/68
[52] U.S. Cl. .................................... 430/281; 430/282; 430/277; 430/916; 204/157.15
[58] Field of Search ............... 430/280, 270, 326, 281; 204/159.16

[56] References Cited
U.S. PATENT DOCUMENTS

| | | | |
|---|---|---|---|
| 3,751,259 | 8/1973 | Bauer et al. | 96/115 P |
| 3,887,450 | 6/1975 | Gilano et al. | 204/159.16 |
| 3,953,309 | 4/1976 | Gilano et al. | 204/159.16 |
| 4,162,274 | 7/1979 | Rosenkranz | 528/75 |
| 4,228,232 | 10/1980 | Rousseau | 430/271 |
| 4,234,675 | 11/1980 | Kuznetsov | 430/271 |
| 4,304,923 | 12/1981 | Rousseau | 560/26 |
| 4,485,167 | 11/1984 | Briney et al. | 430/281 |
| 4,517,281 | 5/1985 | Briney et al. | 430/322 |
| 4,579,806 | 4/1986 | Schupp et al. | 430/280 |

FOREIGN PATENT DOCUMENTS

| | | |
|---|---|---|
| 0164270 | 12/1985 | European Pat. Off. . |
| 1797373 | 8/1971 | Fed. Rep. of Germany . |
| 0190211 | 1/1967 | U.S.S.R. . |

Primary Examiner—John L. Goodrow
Attorney, Agent, or Firm—Keil & Weinkauf

[57] ABSTRACT

A photosensitive recording element which is suitable for the production of printing plates or resist images possesses a photopolymerizable recording layer which is applied to a dimensionally stable base, can be developed in an aqueous alkaline medium and contains, as a polymeric binder, one or more film-forming copolymers which are insoluble in water but soluble or dispersible in aqueous alkaline solutions and consist of from 10 to 50% by weight of one or more N-vinylamides, preferably N-vinylcaprolactam and/or N-vinylpyrrolidone, from 5 to 30% by weight of acrylic acid and/or methacrylic acid, from 30 to 80% by weight of one or more comonomers from the group consisting of the vinyl aromatics and (meth)acrylates of monoalkanols and from 0.2 to 5% by weight of an olefinically unsaturated compound which contains basic nitrogen atoms and has a $pK_a > 4$.

11 Claims, No Drawings

PHOTOSENSITIVE ELEMENT FOR PRODUCING PRINTING PLATES OR RESIST IMAGES

The present invention relates to a photosensitive recording element having a photopolymerizable recording layer which is applied to a base, can be developed in an aqueous alkaline medium and contains a polymeric binder, the said recording element being particularly suitable for the production of printing plates or resist images.

The known photosensitive recording elements which can be washed out with aqueous alkaline developers and are intended for the production of photopolymer printing plates or resist images contain, on a dimensionally stable base, e.g. a plastic film or a metal sheet, a photopolymerizable recording layer generally consisting of a mixture of one or more polymeric binders which are soluble or dispersable in the aqueous alkaline developers, one or more ethylenically unsaturated, photopolymerizable, low molecular weight compounds and one or more photoinitiators, with or without further additives and/or assistants which improve and/or modify the processing properties and/or performance characteristics.

Polymeric binders used for the photopolymerizable recording layers which can be developed in an aqueous alkaline medium are, in particular, copolymers which are soluble or dispersable in the aqueous alkaline developers and contain carboxyl or carboxylic anhydride groups, for example styrene/maleic anhydride copolymers, styrene/maleic half ester copolymers, alkyl (meth)acrylate/(meth)acrylic acid copolymers or copolymers of styrene, alkyl(meth)acrylates and (meth)acrylic acid and, if required, other comonomers (cf. inter alia DE-B-20 27 467, USSR Pat. No. 190,211, DE-A-22 05 146, EP-A-49 504 or DE-A-27 36 058).

It is also known that photopolymer printing or relief plates can be produced using photopolymerizable mixtures which contain, in addition to photopolymerizable monomers, one or more photoinitiators and, if required, further additives and/or assistants, vinylpyrrolidone polymers, e.g. polyvinylpyrrolidone or vinylpyrrolidone/vinyl acetate copolymers as polymeric binders (cf. for example DE-A-17 97 373). These photopolymerizable mixtures can be developed with aqueous solvents, in particular pure water.

The known photosensitive recording materials which can be developed in aqueous media can be used, and are suitable, for many purposes, but many of their properties are unsatisfactory. For example, in the photopolymerized state, they are frequently too sensitive to the washout medium, i.e. the sensitivity to overwashing during development is high, or the printing plates or resist images produced from them are not sufficiently resistant to the aqueous media employed when the said plates or images are used. Fine image elements are often difficult to reproduce with these recording materials, and the wash-out conditions such as washout time, temperature and composition of the developer have to be maintained within very narrow limits. Furthermore, residual layers are readily formed during development of the known materials which can be developed in aqueous alkaline media, i.e. those parts of the recording layer which are not photopolymerized during imagewise exposure cannot be removed completely and satisfactorily from the base. This phenomenon, which occurs in particular when metallic bases or substrates are used for the photopolymerizable recording layer, is particularly problematic in the production of resist images and lithographic printing plates. Moreover, the conventional polymeric binders for the said recording materials only possess limited compatibility with the conventional photopolymerizable compounds used in these recording materials, with the result that either the range of use of the photopolymerizable compounds is restricted or the exposure properties of the photopolymerizable recording layers are not satisfactorily in practice.

European Pat. No. 0,164,270 discloses photopolymerizable compositions which can be developed in water and contain a copolymer of an α,β-ethylenically unsaturated carboxylic acid and a vinyl monomer, a vinyl compound having a secondary or tertiary nitrogen atom, an ethylenically unsaturated monomeric compound and a photoinitiator. In these compositions, therefore, some of the carboxyl groups of the copolymer are neutralized by the secondary or tertiary nitrogen atoms of the monomeric vinyl compound. However, the compatibility and resilience of compositions of this type are unsatisfactory in many respects in practice.

It is an object of the present invention to provide novel photosensitive recording elements which have a photopolymerizable recording layer developable in an aqueous alkaline medium and are suitable for the production of photopolymer printing plates or resist images. It is the particular object of the present invention to provide photosensitive recording elements of this type which are distinguished by very good compatibility of the polymeric binder with the conventionally used photopolymerizable compounds, have good developability and a very wide development latitude during washout with aqueous alkaline developers and at the same time, in the exposed state, are highly resistant to aqueous media, including weakly alkaline aqueous solutions, without their general property profile being adversely effected. The photopolymerizable recording layers which can be developed in an aqueous alkaline medium should exhibit good adhesion, in particular to metallic bases or substrates without residual layers being formed during processing. Very generally, the novel photosensitive recording elements which can be developed in an aqueous alkaline medium should possess good processing properties and performance characteristics, such as good exposure properties, should permit exact and reliable reproduction even of fine image elements, should be suitable for a wide range of uses and should be capable of being adjusted simply, readily and optimally for various intended uses.

German Patent Application No. P 34 47 356.4 has already proposed a photosensitive recording element which contains, as a polymeric binder in the photopolymerizable recording layer, a film-forming copolymer of from 10 to 50% by weight of a vinylamide, from 5 to 30% by weight of (meth)acrylic acid and from 30 to 80% by weight of a hydrophobic comonomer.

In the production of resists, the polyethylene protective film is peeled off on an automatic laminator, and the polyester base film/resist film laminate is cut to size with a knife. Because of the brittleness of the unexposed resist, parts of the resist flake away at the cut edge of the polyester film during this process. For the user, it is also necessary to be able to correct the developed resist; for example, projections on a plate which project into a developed area (for example as a result of a defective negative) are cut off or corrected with a scalpel. During this process, parts must not break off from the area to be protected. Furthermore, the exposed resist must be very resilient.

According to the prior art, the resilience can be increased by incorporating plasticizers into the photopolymerizable material. However, this is not completely satisfactory since such plasticizers tend to migrate into the film during ageing and contribute to a great extent to cold flow. However, cold flow cannot be tolerated since the film rolls are stored under static load and, after a short time, the photopolymerizable material begins to seep out from between the layers. Thereafter, the material fuses together along the edge of the rolls after seepage and makes it difficult, if not impossible, to unroll the material uniformly and without destroying the assembled film. Furthermore, many plasticizers are volatile. During production of the film, a little of the plasticizer evaporates unless drying is carefully controlled, the film being returned to its brittle state.

The intention therefore is to improve the resilience and compatibility of the polymeric binder with oligomers and to reduce the cold flow of the recording element on the roll.

We have found, surprisingly, that this object is achieved by photosensitive recording elements having a photopolymerizable recording layer which is applied to a dimensionally stable base and can be developed in an aqueous alkaline medium, if the said recording layer contains, as a polymeric binder, one or more film-forming copolymers which are insoluble in water but soluble or dispersible in aqueous alkaline solutions and consist of from 10 to 50% by weight of one or more N-vinylamides, from 5 to 30% by weight of acrylic acid and/or methacrylic acid and from 30 to 80% by weight of one or more comonomers from the group consisting of the vinyl aromatics and esters of (meth)acrylic acid with $C_1$-$C_8$-monoalkanols and from 0.2 to 5% by weight of a copolymerizable, olefinically unsaturated organic compound which contains basic nitrogen atoms and has a $pK_a > 4$.

The present invention accordingly relates to a photosensitive recording element which is suitable for the production of photopolymer printing plates or resist images and possesses a photopolymerizable recording layer which is applied to a dimensionally stable base, can be developed in an aqueous alkaline medium and contains a polymeric binder, wherein the said recording layer contains, as a polymeric binder, one or more film-forming copolymers which are insoluble in water but soluble or dispersible in aqueous alkaline solutions and consist of from 10 to 50% by weight of one or more N-vinylamides, from 5 to 30% by weight of acrylic acid and/or methacrylic acid and from 30 to 80% by weight of one or more comonomers from the group consisting of the vinyl aromatics and esters of acrylic acid or methacrylic acid with monoalkanols of 1 to 8 carbon atoms and from 0.2 to 5% by weight of one or more copolymerizable, olefinically unsaturated organic compounds which contain basic nitrogen atoms and have a $pK_a > 4$.

Preferred copolymerizable olefinically unsaturated organic compounds containing basic nitrogen atoms and having a $pK_a > 4$ are compounds of the general formulae

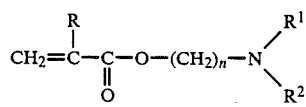 (I)

and/or

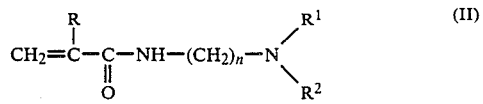 (II)

where n is from 2 to 6, R is hydrogen or methyl, $R^1$ and $R^2$ are identical or different and are each hydrogen, a straight-chain or branched alkyl or hydroxyalkyl radical of 1 to 6 carbon atoms, a straight-chain or branched hydroxyalkyl radical of 1 to 6 carbon atoms whose hydroxyl groups are etherified with alkanols of 1 to 4 carbon atoms, or cycloalkyl of 5 or 6 carbon atoms, or $R^1$ and $R^2$ together form a five-membered or six-membered ring which may contain a further hetero atom, as well as N-vinylimidazole and 2-methyl-1-vinylimidazole.

Using the special copolymers, according to the invention, as polymeric binders in the photopolymerizable recording layers gives photosensitive recording elements having very advantageous properties. The copolymer to be used according to the invention is highly compatible with polymerizable oligomers, for example, when the said copolymer has a K value (according to Fikentscher) of from 32 to 36 and is used in the concentrations of interest in practice. Because of the improved compatibility of the said copolymers with photopolymerizable monomers and oligomers, it is possible to use a wide variety of such photopolymerizable monomers and/or oligomers, including polyfunctional ones, in the photopolymerizable recording layers, even in large amounts. Consequently, the property spectrum of the printing plates or resist images produced using the novel recording elements can be varied readily and in a simple manner. In spite of good developability in purely aqueous alkaline developers, the recording materials in the photopolymerized state are highly resistant to aqueous media, as employed, for example, in connection with the printing plates and in particular when resist images are used in etching or electroplating. The novel photosensitive recording elements have little sensitivity to overwashing, the photopolymerizable recording layer is stable even on metallic bases or substrates while still exhibiting good adhesion to these bases or substrates, and the said recording elements permit exact and reliable reproduction of even fine image elements, for example lines 100 μm wide or less. Because of the good differentiation in the adhesion of the novel photopolymerizable recording layers, the photosensitive recording elements can also advantageously be used as dry film resists for dry lamination.

The polymeric binders present according to the invention in the photopolymerizable recording layer of the photosensitive recording elements are copolymers which are insoluble in pure water but soluble or dispersible in aqueous alkaline solutions. Preferably, the N-vinylamide copolymers modified according to the invention are soluble or dispersible in aqueous alkaline solutions having a pH greater than about 9, in particular about 9-13, but insoluble in aqueous alkaline solutions having a pH of less than about 9. The copolymers to be used according to the invention should moreover be film-forming and generally have a mean molecular weight (weight average) greater than about 10,000, preferably from about 15,000 to about 500,000, in particular from about 20,000 to 250,000.

The said copolymers are composed of four different types of comonomers, i.e. (a) N-vinylamides, (b) acrylic and/or methacrylic acid, (c) vinylaromatics and/or (meth)acrylates of monoalkanols and (d) copolymerizable olefinically unsaturated compounds which contain basic nitrogen atoms and have a $pK_a > 4$. Advantageous esters of (meth)acrylic acid with monoalkanols have proven to be those which, as such, are capable of forming homopolymers having a glass transition temperature (measured by the DSC method) of greater than 300K, in particular greater than 320K. The comonomers for the preparation of the copolymers to be used according to the invention should of course be copolymerizable with one another.

The copolymer to be used according to the invention as a polymeric binder contains, as copolymerized units, (a) from 10 to 50% by weight of one or more N-vinylamides, (b) from 5 to 30% by weight of acrylic acid and/or methacrylic acid, (c) from 30 to 80% by weight of one or more comonomers from the group consisting of the vinyl aromatics and esters of acrylic acid or methacrylic acid with monoalkanols of 1 to 8 carbon atoms and (d) from 0.2 to 5% by weight of one or more copolymerizable olefinically unsaturated organic compounds which contain basic nitrogen atoms and have a $pK_a > 4$, the sum of the percentages stated under (a) to (d) being 100. Examples of suitable N-vinylamides are the N-vinyl derivatives of aliphatic carboxamides, such as N-vinylformamide, N-vinylacetamide or N-vinyl-N-methyl-acetamide. The copolymers to be used according to the invention preferably contain N-vinyl-lactams, in particular N-vinylpyrrolidone and/or N-vinyl-caprolactam, as polymerized N-vinylamide comonomers. The copolymers may contain one or more of the N-vinylamide comonomers as copolymerized units, the amount of the N-vinylamide comonomer units polymerized in the copolymer being from 10 to 50, preferably from 20 to 45, % by weight, based on the copolymer.

The copolymer to be used according to the invention contains, as a second group of polymerized comonomers, acrylic acid and/or methacrylic acid in an amount of from 5 to 30, in particular from 5 to 15, % by weight, based on the copolymer.

Examples of the comonomers present as the third component in the form of copolymerized units in the said copolymer are vinylaromatics, e.g. styrene, styrenes which are substituted in the side chain or in the nucleus, for example by alkyl or halogen, such as α-methylstyrene and p-methylstyrene, the esters of acrylic acid and methacrylic acid with $C_1$–$C_8$-monoalkanols, in particular the acrylates and methacrylates of straight-chain or branched monoalkanols, preferably of 1 to 4 carbon atoms, methyl methacrylate being one of the particularly advantageous compounds of this type. The copolymer may contain one or more of these vinyl aromatics and/or (meth)acrylates as copolymerized units, the amount of these in the copolymer being from 30 to 80, preferably from 40 to 70, % by weight based on the copolymer.

The copolymer to be used according to the invention contains, as the fourth group of polymerized comonomers, one or more copolymerizable olefinically unsaturated organic compounds which contain basic nitrogen atoms and have a $pK_a > 4$. Preferred compounds of this type are compounds of the general formulae

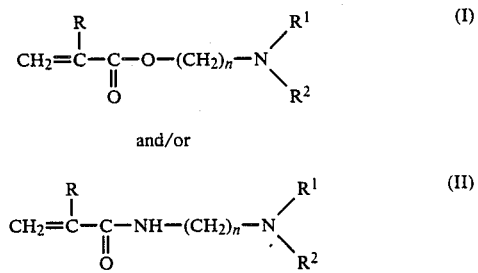

where n is from 2 to 6, R is hydrogen or methyl, and $R^1$ and $R^2$ are identical or different and are each hydrogen, a straight-chain or branched alkyl or hydroxyalkyl radical of 1 to 6 carbon atoms, a straight-chain or branched hydroxyalkyl radical of 1 to 6 carbon atoms whose hydroxyl groups are etherified with alkanols of 1 to 4 carbon atoms, or cycloalkyl of 5 or 6 carbon atoms, or $R^1$ and $R^2$ together form a five-membered or six-membered ring which may contain a further hetero atom, as well as N-vinylimidazole and 2-methyl-1-vinylimidazole.

Dialkylaminoalkyl (meth)acrylates and dialkylamino(meth)acrylamides of the general formulae (I) and/or (II), where n is from 2 to 6 and $R^1$ and $R^2$ are straight-chain alkyl of 1 to 4 carbon atoms, e.g. dimethylaminoethyl acrylate, dimethylaminoethyl methacrylate, diethylaminoethyl methacrylate, diethylaminoethyl acrylate, diethylaminoethyl acrylamide, dimethylaminoethyl acrylamide, diethylaminoethyl methacrylamide and dimethylaminoethyl methacrylamide, are particularly preferred. The olefinically unsaturated comonomers containing basic nitrogen atoms are present in the copolymer in amounts of from 0.2 to 5, preferably from 1.5 to 2.5, % by weight, based on the copolymer.

Examples of copolymers which have proven particularly advantageous for use, according to the invention, as a polymeric binder in the photopolymerizable recording layers of the photosensitive recording elements include N-vinyllactam/(meth)acrylic acid/methyl methacrylate/dimethylaminoethyl (meth)acrylate copolymers or N-vinyllactam/(meth)acrylic acid/styrene/-dimethylaminoethyl (meth)acrylate copolymers. In a typical embodiment, these copolymers contain, for example, from 25 to 35% by weight of N-vinylcaprolactam and/or N-vinylpyrrolidone, from 5 to 15% by weight of (meth)acrylic acid and from 55 to 65% by weight of methyl methacrylate and from 1.5 to 2.5% by weight of dimethylaminoethyl (meth)acrylate as copolymerized units, the percentage in each case being based on the copolymer.

The type and amount of the comonomers for the said copolymers are chosen, within the general conditions stated above, so that the copolymers are film-forming and meet the requirements set in respect of their solubility or dispersibility. The limits for the amount of the individual comonomer groups are important in view of the general properties of the copolymers and in particular the novel photosensitive recording elements produced from them. If the content of the individual comonomers in the copolymers is outside these limits, the properties of the said recording elements and those of the printing plates or resist images produced from these elements are adversely effected.

The copolymers to be used according to the invention as a polymeric binder can be prepared by copolymerization of the comonomers by conventional polymerization methods, for example in solution. Examples of suitable solvents for solution polymerization are lower alkanols, ketones, esters and the like, such as methanol, acetone, methyl ethyl ketone, ethyl acetate, etc. Suitable polymerization initiators are the conventional free radical initiators, for example azobisisobutyronitrile, benzoyl peroxide and the like.

The photopolymerizable recording layer of the novel photosensitive recording elements may contain one or more modified N-vinylamide copolymers of the type under discussion, as a polymeric binder. In addition to the polymeric binder, the said recording layer contains in general one or more ethylenically unsaturated, photopolymerizable compounds and one or more photopolymerization initiators or a photopolymerization initiator system, with or without further additives and/or assistants for improving and/or modifying the general properties of the photosensitive recording elements and of the printing plates or resist images produced from them.

Suitable ethylenically unsaturated, photopolymerizable compounds are both monomers and ethylenically unsaturated, photopolymerizable oligomers. The monomers generally have a molecular weight of less than 1000. The mean molecular weight (number average) of the said oligomers is preferably from about 1,000 to 10,000, in particular from about 1,500 to 6,000. The photopolymerizable monomers and oligomers may be either monofunctional or polyfunctional, i.e. may possess one or more photopolymerizable, ethylenic double bonds. Usually, the photopolymerizable recording layer contains bifunctional or polyfunctional ethylenically unsaturated, photopolymerizable compounds alone or as a mixture with a minor amount of monofunctional ethylenically unsaturated, photopolymerizable compounds. Because of the good compatibility of the special N-vinylamide copolymers to be used according to the invention as the polymeric binder, a large number of monomers and oligomers, which may be used alone or as a mixture with one another, are suitable as photopolymerizable compounds in the novel photosensitive recording elements.

Typical examples of the photopolymerizable monomers are, in particular, the derivatives of (meth)acrylic acid and, very particularly, the (meth)acrylates. Examples of these are the di- and tri(meth)acrylates of ethylene glycol, diethylene glycol, triethylene glycol and polyethylene glycols having a molecular weight up to about 500, propane-1,2-diol, propane-1,3-diol, polypropylene glycols having a molecular weight up to about 500, butane-1,4-diol, 1,1,1-trimethylolpropane, 2,2-dimethylpropanediol, glycerol and pentaerythritol; pentaerythritol tetra(meth)acrylate, glucose tri- or tetra(meth)acrylate, and the monoacrylates and monomethacrylates of the stated diols and polyols, e.g. ethylene glycol mono(meth)acrylate, di-, tri- or tetraethylene glycol mono(meth)acrylate, propanediol mono(meth)acrylate and butanediol mono(meth)acrylate and the (meth)acrylates of monoalkanols, in particular those of 1 to 20 carbon atoms. In addition to the preferred acrylates and methacrylates of the abovementioned type, further photopolymerizable monomers are the allyl compounds and other vinyl compounds, e.g. N-vinylpyrrolidone, N-vinylcaprolactam, vinyl acetate, vinyl propionate, (meth)acrylamide, N-methylol(meth)acrylamide, the bisether of ethylene glycol and of N-methylol(meth)acrylamide, vinyl carbamates, bisacrylamidoacetic acid, glyoxalbisamide and others.

Other very suitable ethylenically unsaturated, photopolymerizable compounds for the novel photosensitive recording elements are the monomeric urethane acrylates and methacrylates containing two or more acryloyl and/or methacryloyl groups. Such monomeric urethane (meth)acrylates can be obtained, for example, by reacting aliphatic di- or polyols with organic diisocyanates in amounts such that the ratio of the number of equivalents of OH to the number of equivalents of NCO is about 1:2, and then reacting the free isocyanate groups of the resulting reaction product with suitable acryloyl and/or methacryloyl compounds, for example hydroxyalkyl (meth)acrylates. Suitable aliphatic diols or polyols include the di- and polyhydroxy compounds mentioned in connection with the di- and tri(meth)acrylates; examples of organic diisocyanates are hexamethylene diisocyanate, toluylene diisocyanate, isophorone diisocyanate and the like; hydroxyalkyl (meth)acrylates are, for example, hydroxyethyl (meth)acrylate, propanediol mono(meth)acrylate and butanediol mono(meth)acrylate. Equally suitable and advantageous monomers are those possessing two or more acryloyl and/or methacryloyl groups, as can be obtained, for example, by reacting di- or polyglycidyl compounds with acrylic acid and/or methacrylic acid. Particularly suitable di- and polyglycidyl compounds in this context are the di- and polyglycidyl ethers of polyhydric phenols, for example of bisphenol A or the substitution products of bisphenol A. Particular examples of such monomers containing acryloyl and/or methacryloyl groups are the reaction products of bisphenol A bisglycidyl ether with acrylic and/or methacrylic acid in a molar ratio of about 1:2.

It has proven particularly advantageous, particularly for the production of resist images, if the photosensitive recording elements contain, as photopolymerizable compounds in the photopolymerizable recording layer, oligomers possessing 2 or, preferably, more than 2 acryloyl and/or methacryloyl groups. These may be, for example, oligomeric urethane resins containing acryloyl and/or methacryloyl groups or those based on di- or polyepoxides, as are known per se and described in the literature. Of particular interest are those oligomers of the type under discussion which contain not only theacryloyl and/or methacryloyl groups but also free carboxyl groups in the molecule. The content of free carboxyl groups in these photopolymerizable oligomers is advantageously sufficiently high for the oligomers to have an acid number of from 50 to 150 mg of KOH/g. Suitable photopolymerizable oligomers of this type, as may also be present in the novel photosensitive recording elements, are described in, for example, DE-A-24 42 527, DE-C-25 57 408 or DE-A-29 17 483. Other photopolymerizable oligomers which have given particularly advantageous results when used in the said recording elements can be prepared, for example, by reacting the hydroxyl groups of a diol or polyol compound containing acryloyl and/or methacryloyl groups with polybasic carboxylic acids or their derivatives, in particular cyclic carboxylic anhydrides, in such a way that the acidic partial esters of the polybasic carboxylic acids are formed, and then reacting some of the free carboxyl groups of the resulting reaction product with di- and/or polyepoxides, with chain extension and, if appropriate, branching. The said diol or polyol compounds, which serve as starting materials for the preparation of such oligomers, are advantageously prepared by reacting di- or polyepoxide compounds, e.g. di- or polyglycidyl ethers or di- or polyglycidyl esters with acrylic acid and/or methacrylic acid in a ratio such that the number of equivalents of glycidyl groups to that of COOH groups is about 1:1. Furthermore, the di- or polyepoxide compounds can be subjected to a preliminary chain-extending reaction with dicarboxylic acids, for example before or during the reaction with the (meth)acrylic acid. Typical examples of oligomers of the last-mentioned type are the products obtainable by reacting bisphenol A bisglycidyl ether with acrylic and/or methacrylic acid or with a mixture of about 30–70 mol % of a dicarboxylic acid, e.g. adipic acid, and about 30–70 mol % of acrylic and/or methacrylic acid in a ratio such that the number of equivalents of glycidyl groups to the total number of equivalents of COOH is about 1:1, reacting the hydroxyl groups of the resulting reaction product with a cyclic dicarboxylic anhydride, e.g. phthalic anhydride, if necessary as a mixture with a minor amount of the anhydride of another polybasic carboxylic acid, e.g. trimellitic anhydride, in a ratio such that the number of equivalents of OH groups to that of anhydride groups is about 1:1, with formation of the acidic partial esters of the polybasic carboxylic acids, and finally reacting some of the free carboxyl groups of the resulting reaction product with a di- and/or polyglycidyl ether, for example bisphenol A bisglycidyl ether or pentaerythritol triglycidyl ether, in a ratio such that the number of equivalents of COOH groups to that of glycidyl groups is greater than 1:1, preferably from about 1.15:1 to 5:1.

The ethylenically unsaturated, photopolymerizable monomers and/or oligomers are chosen so that they are compatible with the modified N-vinylamide copolymers used as the polymeric binder. The ratio of polymeric binder to the ethylenically unsaturated, photopolymerizable compounds in the photopolymerizable recording layer of the novel photosensitive recording elements can be varied within wide limits and may be, for example, from 1:99 to 90:10. A small amount of polymeric binder, for example from about 1 to 35% by weight, based on the photopolymerizable recording layer, is particularly suitable when the said recording layer contains, as an ethylenically unsaturated, photopolymerizable compound, a large amount, for example 40% by weight or more, in particular more than about 45% by weight, based on the photopolymerizable recording layer, of one or more oligomers containing more than two acryloyl and/or methacryloyl groups and free carboxyl groups.

Suitable photoinitiators for the photopolymerizable recording layers are the photoinitiators and photoinitiator systems known per se and usually employed for photosensitive, photopolymerizable recording materials. Examples of these are benzoin, benzoin ethers, in particular benzoin alkyl ethers, substituted benzoins, alkyl ethers of substituted benzoins, such as α-methylbenzoin alkyl ethers or α-hydroxymethylbenzoin alkyl ethers; benzils, benzil ketals, in particular benzil dimethyl ketal, benzil methyl ethyl ketal or benzil methyl benzyl ketal; the acyl phosphine oxide compounds which are known, effective photoinitiators, eg. 2,4,6-trimethylbenzoyldiarylphosphine oxide; benzophenone, derivatives of benzophenone, 4,4'-dimethylaminobenzophenone, 4,4'-diethylaminobenzophenone and derivatives of Michler's ketone; anthraquinone and substituted anthraquinones, aryl-substituted imidazoles and their derivatives, eg. 2,4,5-triarylimidazoledimers; 2-chlorothioxanthone and the acridine and phenacine derivatives which are effective photoinitiators. Examples of initiator systems are combinations of the stated initiators with sensitizers or activators, in particular tertiary amines. Typical examples of such initiator systems are combinations of benzophenone or benzophenone derivatives with tertiary amines, such as triethanolamine or Michler's ketone; and mixtures of 2,4,5-triarylimidazole dimers and 2-mercaptobenzoquinazole and the leuco bases of triphenylmethane dyes. The choice of suitable photoinitiators or photoinitiator systems is familiar to the skilled worker. The photoinitiators and photoinitiator systems are present in the photopolymerizable recording layer in general in amounts of from 0.001 to 10, preferably from 0.05 to 5, % by weight, based on the photopolymerizable recording layer.

Examples of other suitable additives and/or assistants which may be present in the photopolymerizable recording layer of the novel photosensitive recording elements are thermal polymerization inhibitors, dyes and/or pigments, photochromic compounds or systems, sensitometric regulators, plasticizers, leveling agents, dulling agents, lubricants and the like. Examples of suitable thermal polymerization inhibitors are hydroquinone, hydroquinone derivatives, 2,6-di-tert-butyl-p-cresol, nitrophenols and N-nitrosamines, such as N-nitrosodiphenylamine or the salts of N-nitrosocyclohexylhydroxylamine. Examples of dyes and/or pigments which may act as contrast agents as well as reinforcing the layer include Brilliant Green Dye (C.I. 42,040), Victoria Sky Blue FGA, Victoria Sky Blue BO (C.I. 42,595), Victoria Blue B (C.I. 44,045), Rhodamine 6 G (C.I. 45,160), triphenylmethane dyes, naphthalimide dyes, azosols and 3'-phenyl-7-dimethylamino-2,2'-spirodi-(2H-1-benzopyran). Photochromic systems which change their color reversibly or irreversibly on exposure to actinic light without adversely effecting the photopolymerization process are, for example, leuco dyes together with suitable activators. Examples of leuco dyes are the leuco bases of triphenylmethane dyes, such as crystal violet leuco base and malachite green leuco base, leuco basic blue, leuco pararosaniline, leuco patent blue A or V; rhodamine B base is also suitable. Suitable activators for these photochromic compounds include organic halogen compounds which donate halogen radicals on exposure to actinic light, or hexaaryl bisimidazoles. The sensitometric regulators include compounds such as 9-nitroanthracene, 10,10'-bisanthrone, phenazinium, phenoxazinium, acridinium and phenothiazinium dyes, in particular in combination with mild reducing agents, 1,3-dinitrobenzenes and the like. Suitable plasticizers are the conventional low molecular weight or high molecular weight esters, such as phthalates or adipates, toluenesulfonamide and tricresyl phosphate. The additives and/or assistants are present in the photopolymerizable recording layers in the effective amounts conventionally used for these substances. However, the amount of these should not in general exceed 30, preferably 20, % by weight, based on the photopolymerizable recording layer.

The ratio in which the individual components are present in the photopolymerizable recording layer is in general chosen so that this recording layer not only can be developed in an aqueous alkaline medium but advantageously is also solid and non-tacky at room temperature and has good film formation properties. Where the novel photosensitive recording elements are used as photoresist films, the composition is moreover chosen so that the photopolymerizable recording layer can readily be laminated and can be transferred to a substrate with the use of pressure and, if necessary, heat. The thickness of the photopolymerizable recording layer is known to depend on the intended use of the photosensitive recording elements and can therefore vary within wide limits. For the production of letterpress or gravure printing plates, the said recording layer is generally from about 100 μm to a few mm thick; for the production of resist images, the photopolymerizable recording layer is usually brought to a thickness of about 1–50 μm; for lithographic printing plates, the said recording layer is generally about 0.5–6 μm thick.

In a typical embodiment of the invention, the photopolymerizable recording layer of the photosensitive recording elements consists of a homogeneous, film-forming mixture which is soluble or dispersible in aqueous alkaline solutions and consists of (a) from 40 to 90% by weight of one or more N-vinylamide copolymers of the abovementioned type modified according to the invention, as the polymeric binder, (b) from 8 to 55% by weight of one or more ethylenically unsaturated, photopolymerizable monomers which are compatible with the polymeric binder or binders, in the case of high monomer contents if necessary also as a mixture with a minor amount of one or more compatible, photopolymerizable oligomers, (c) from 0.001 to 10% by weight of one or more photopolymerization initiators and (d) from 0 to 30, preferably from 0.05 to 20, % by weight of further additives and/or assistants which improve or modify the general properties of the recording elements and of the printing plates or resist images produced from them.

As stated above, the photopolymerizable recording layers can however also contain less than 40, for example from only 1 to about 35, % by weight, based on the said recording layer, of the polymeric binder or binders. In this case, the said recording layer contains, in addition to the photoinitiator and any further additives and/or assistants, not less than 40, preferably from 45 to 75, by weight, based on the photopolymerizable recording layer, of one or more oligomers which are soluble or dispersible in aqueous alkaline solutions and have more than two ethylenic, photopolymerizable double bonds, in particular acryloyl and/or methacryloyl groups, and preferably free carboxyl groups and have a mean molecular weight (number average) of about 1,000 to 10,000. In addition to the photopolymerizable oligomers, the said recording layer can in these cases also contain photopolymerizable monomers, in particular in an amount of from about 1 to 30, preferably from about 10 to 25, % by weight, based on the said recording layer. Such photopolymerizable recording layers containing a very small amount of polymeric binder are particularly useful for thin layers, as used, for example, in the production of resist images and photoresist films.

Suitable bases for the photopolymerizable recording layers are the dimensionally stable, rigid or, preferably, flexible bases known per se and conventionally used for the photosensitive recording elements of the type under discussion, the type of base being determined by, inter alia, the intended use of the photosensitive recording elements. For example, particularly suitable dimensionally stable bases for the production of printing plates are plastic films or sheets, for example those of polyesters, and metallic bases, for example those of steel or aluminum. Preferably used bases for photoresist films or photosensitive film resist materials are plastic films or sheets, in particular polyester sheets, which possess moderate adhesion to the photopolymerizable recording layer and, after lamination of the said recording layer with a substrate, can be peeled off from the latter, before or after exposure to actinic light. For the production of resist images, the photopolymerizable recording layer can also be applied directly to the substrate which is to be protected and, if necessary, permanently modified and which then acts as the base for the photopolymerizable recording layer. Examples of suitable substrates for photoresist layers are copper sheets, copper-plated bases, ceramic substrates which are coated with metallic or metal oxide layers, semiconductor elements, silicon wafers and the like. The bases for the photopolymerizable recording layers can, if necessary, be pretreated in a conventional manner, for example mechanically, chemically, electrochemically and/or by coating with an adhesive. Furthermore, one or more intermediate layers may be arranged between the photopolymerizable recording layer and the base. In the case of photosensitive recording elements for the production of printing plates, in particular letterpress or gravure printing plates, these intermediate layers can be in the form of an adhesion-promoting layer and/or an antihalation layer. In the case of photoresist films and photosensitive film resist materials, an intermediate layer of this type between the photopolymerizable recording layer and the peelable, temporary base can make it easier to peel off the base after lamination of the photopolymerizable recording layer with the substrate and/or can serve as an oxygen barrier layer after the base has been peeled off.

It is also possible to arrange a top layer or cover sheet on that surface of the photopolymerizable recording layer which faces away from the base, the said layer or cover sheet preferably being soluble in the same developer as the said recording layer or being capable of being peeled off from the latter. This top layer or cover sheet serves in particular to protect the said recording layer during storage and handling of the photosensitive recording elements and may also serve as an oxygen barrier for the photopolymerizable recording layer. Top layers which have proven particularly suitable are, for example, those consisting of polyvinyl alcohols or polyvinyl alcohol derivatives or, particularly in the case of photoresist films, cover sheets of polyolefins, e.g. polyethylene or polypropylene.

The novel photosensitive recording elements can be produced in a conventional manner by preparing a homogeneous mixture of the components forming the photopolymerizable recording layer and applying this mixture in the form of a layer onto the base, which may or may not have been provided with an intermediate layer. For example, the components of the photopolymerizable recording layer can be mixed homogeneously in a purely mechanical manner in a suitable mixing apparatus, for example a mixer or extruder, and this mixture can be shaped, for example by extrusion, calendering or pressing, to give a layer of the desired thickness, which is then laminated with the base. Advantageously, however, the photosensitive recording elements are produced by dissolving the components of the photopolymerizable recording layer in a suitable solvent or solvent mixture and applying this solution to the base by casting, immersion, spraying or another known application technique to give a layer of the desired thickness. Thereafter, the solvent is removed in a conventional manner and the photopolymerizable recording layer is dried. Suitable solvents for mixing the components and applying the photopolymerizable recording layer to the base include lower alcohols, ketones and esters, e.g. methanol, acetone, methyl ethyl ketone, ethyl acetate and the like, as well as mixtures of these. The top layer or cover sheet can, if desired, then be applied to the photopolymerizable recording layer.

The novel photosensitive recording elements can advantageously be used for the production of printing plates or resist images by the methods conventionally used for this purpose. To do this, the photopolymerizable recording layer is exposed imagewise to actinic light, in the case of photoresist films and photosensitive film resist materials this being effected after lamination with the substrate to be protected. Light sources which are suitable for this purpose are the conventional sources of actinic light, for example UV fluorescent tubes, high pressure, medium pressure or low pressure mercury lamps, superactinic fluorescent tubes and pulsed xenon lamps, as well as UV lasers, argon lasers and the like. The wavelength emitted oy the light sources should generally be from 230 to 450 nm, preferably from 300 to 420 nm and in particular should be matched with the self-absorption of the photoinitiator present in the photopolymerizable recording layer.

Imagewise exposure to actinic light initiates photopolymerization in the exposed parts of the recording layer, this photopolymerization leading to crosslinking in the exposed parts of the layer and hence to a differentiation in the solubilities of the exposed and unexposed parts of the layer. After imagewise exposure, the printing plate or resist image is developed by washing out the unexposed, uncrosslinked parts of the recording layer with an aqueous alkaline developer. Development may be effected by washing, spraying, rubbing, brushing etc. The novel recording elements have a wide development latitude and very little sensitivity to overwashing. Suitable developers are aqueous alkaline solutions which, in order to obtain the advantageous pH, in general from 8 to 14, preferably about 9–13, contain alkaline substances, e.g. borax, disodium hydrogen phosphate, sodium carbonate, an alkali metal hydroxide or organic base, such as di- or triethanolamine, dissolved in water. The aqueous alkaline developers may also contain buffer salts, for example water-soluble alkali metal phosphates, silicates, borates, acetates or benzoates. Wetting agents, preferably anionic wetting agents, and, if necessary, water-soluble polymers, e.g. sodium carboxymethylcellulose, polyvinyl alcohol, polysodium acrylate and the like, may be used as further components of the developers. Although the novel recording elements are generally washed out with purely aqueous alkaline developers, it is of course possible in principle, although not essential, for the aqueous alkaline developers also to contain small added amounts of water-soluble organic solvents, for example aliphatic alcohols, acetone or tetrahydrofuran.

The novel photosensitive recording elements are distinguished by their good exposure properties and good developability in aqueous alkaline developers, which makes it possible for even very fine image elements to be reproduced faithfully to the original and reliably. On metallic or metal oxide substrates, the novel photopolymerizable recording layers exhibit excellent adhesion without residual layers being deposited in the washed out areas during development of the imagewise exposed recording layer. Furthermore, the recording elements in the exposed, ie. photocrosslinked, state have very high resistance to aqueous media, as are employed, for example, in connection with printing plates or resist images. The novel photosensitive recording materials are suitable in principle for any applications in reprography and optical information fixing.

The Examples which follow illustrate the invention. Parts and percentages are by weight, unless stated otherwise.

EXAMPLE 1

A homogeneous solution was prepared from the following components:
- 20% of a copolymer of 64% of methyl methacrylate, 24% of N-vinylpyrrolidone, 10% of methacrylic acid and 2% of dimethylaminoethyl methacrylate (30% strength in methanol); Fikentscher K value: 37
- 48.4% of an oligomer of bisphenol A diglycidyl ether, phthalic anhydride and acrylic acid, having an acid number of 90 mg of KOH/g (52% strength in ethyl acetate)
- 12.5% of trimethylolpropane triacrylate
- 12.5% of a reaction product of butanediol diglycidyl ether with methacrylic acid
- 2.5% of 2,5-dichloro-1,4-bis[dichloromethyl]benzene
- 3% of benzophenone
- 0.6% of crystal violet leuco base
- 0.15% of Michler's ketone
- 0.1% of 2,6-di-tert-4-methylphenol
- 0.2% of p-aminobenzoic acid
- 0.08% of Flexoblau 810

The filtered solution was cast to give a 38 μm thick resist layer and dried in a conventional drying tunnel at a speed of 9 m per minute to give a flexible film which did not flake when cut and did not exhibit plastic flow on the roll.

EXAMPLE 2

A solution was prepared as described in Example 1 from:
- 21% of the copolymer from Example 1
- 46.37% of the oligomer from Example 1
- 12% of the reaction product of butanediol diglycidyl ether with methacrylic acid
- 12% of trimethylolpropane triacrylate
- 2.5% of 2,5-dichloro-1,4-bis[dichloromethyl]benzene
- 2% of dibutylphthalate
- 0.6% of crystal violet leuco base
- 0.15% of Michler's ketone
- 0.1% of 2,6-di-tert-4-methylphenol
- 0.2% of p-aminobenzoic acid
- 0.08% of Flexoblau 810

A layer was produced as described in Example 1. A flexible layer which did not exhibit cold flow and did not flake when cut resulted.

COMPARATIVE EXAMPLE 1

A solution was prepared as described in Example 1, except that, instead of the base polymer, a polymer of the following composition was used:
- 67.5% of methyl methacrylate
- 22.5% of N-vinylpyrrolidone
- 10% of methacrylic acid
- K value (according to Fikentscher): 37.

When an attempt was made to cast a layer from this solution, separation occurred and a transparent homogeneous film was not obtained.

COMPARATIVE EXAMPLE 2

A solution was prepared as described in Example 1, except that the base polymer had the following composition:
67.5% of methyl methacrylate
22.5% of N-vinylpyrrolidone
10% of methacrylic acid
K value: 23.2

This solution was cast to give a layer and dried in a drying tunnel at 9 m per minute. A homogeneous but tacky film exhibiting pronounced plastic flow on the roll was obtained.

COMPARATIVE EXAMPLE 3

A layer was produced as described in Comparative Example 2, except that the film was dried at 4 m per minute. A resist film exhibiting only slight cold flow was obtained. However, this film was very brittle and exhibited pronounced flaking when cut.

We claim:

1. In a photosensitive recording element which is suitable for the production of negative-working printing plates or resist images and possesses a photopolymerizable recording layer which is applied to a dimensionally stable base, which layer can be developed in an aqueous alkaline medium and which layer contains a polymeric binder, the improvement which comprises: using as the polymeric binder, one or more film-forming copolymers which are insoluble in water but soluble or dispersible in aqueous alkaline solutions and consists essentially of from 10 to 50% by weight of one or more N-vinylamides, from 5 to 30% by weight of acrylic acid, methacrylic acid or a mixture of acrylic acid and methacrylic acid and from 30 to 80% by weight of one or more comonomers from the group consisting of the vinylaromatics and esters of acrylic acid or methacrylic acid with monoalkanols of 1 to 8 carbon atoms and from 0.2 to 5% by weight of at least one copolymerizable, olefinically unsaturated organic compound which contains basic nitrogen atoms and has a $pK_a > 4$, selected from the group consisting of compounds of the formulae

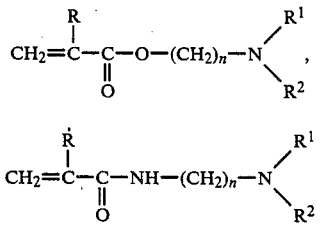

where n is from 2 to 6, R is hydrogen or methyl and $R^1$ and $R^2$ are identical or different and are each hydrogen, a straight-chain or branched alkyl or hydroxyalkyl radical of 1 to 6 carbon atoms, a straight-chain or branched hydroxyalkyl radical of 1 l to 6 carbon atoms whose hydroxyalkyl radical of 1 to 6 carbon atoms whose carbon atoms, or cycloakyl of 5 or 6 carbon atoms, or $R^1$ and $R^2$ together form a five-membered or six-membered ring which may contain a further hetero atom, N-vinylimidazole and 2-methyl-1-vinylimidazole as copolymerized units.

2. A recording element as defined in claim 1, wherein the copolymers present as polymeric binders in the photo-polymerizable recording layer contain, as copolymerized compounds of the formulae (I) and/or (II), dialkylaminoalkyl methacrylates or dialkylaminoalkyl methacrylamides, where n is from 2 to 6 and $R^1$ and $R^2$ are straight-chain alkyl of 1 to 4 carbon atoms.

3. A recording element as defined in claim 1, wherein the copolymers present as polymeric binders in the photo-polymerizable recording layer contain, as copolymerized compounds of the formulae (I) and/or (II), one or more compounds from the group consisting of dimethylaminoethyl acrylate, dimethylaminoethyl methacrylate, diethylaminoethyl acrylate, diethylaminoethyl methacrylate, dimethylaminoethyl acrylamide, dimethylaminoethyl methacrylamide, diethylaminoethyl acrylamide and diethylaminoethyl methacrylamide.

4. A recording element as defined in claim 2, wherein the copolymers present as a polymeric binder in the photo-polymerizable recording layer contain, as copolymerized compounds of the formulae (I) and/or (II), one or more compounds from the group consisting of dimethylaminoethyl acrylate, dimethylaminoethyl methacrylate, diethylaminoethyl acrylate, diethylaminoethyl methacrylate, dimethylaminoethyl acrylamide, dimethylaminoethyl methacrylamide, diethylaminoethylacrylamide and diethylaminoethyl methacrylamide.

5. A photosensitive recording element as defined in claim 1, wherein the copolymers present as polymeric binders in the photopolymerizable recording layer contain, as polymerized N-vinylamide comonomers, one or more N-vinyllactams from the group consisting of N-vinylpyrrolidone and, N-vinylcaprolactam.

6. A photosensitive recording element as defined in claim 1, wherein an N-vinyllactam/(meth)acrylic acid/-methyl methacrylate/dimethylaminoethyl (meth)acrylate copolymer is present as a polymeric binder in the photopolymerizable recording layer.

7. A photosensitive recording element as defined in claim 1, wherein an N-vinyllactam/(meth)acrylic acid/-styrene/dimethylaminoethyl (meth)acrylate copolymer is present as a polymeric binder in the photopolymerizable recording layer.

8. A photosensitive recording element as defined in claim 1, wherein the photopolymerizable recording layer contains, in addition to the polymeric binder, one or more ethylenically unsaturated, photopolymerizable compounds and one or more photoinitiators, with or without further additives or assistants.

9. A photosensitive recording element as defined in claim 8, wherein the photopolymerizable recording layer contains, as ethylenically unsaturated, photopolymerizable compounds, monomers or oligomers possessing two or more acryloyl or methacryloyl groups or a mixture of such monomers, and oligomers.

10. A photosensitive recording element as defined in claim 8, wherein the photopolymerizable recording layer contains the polymeric binders and the ethylenically unsaturated photopolymerizable compound.s in a weight ratio of from 1:99 to 90:10.

11. A photosensitive recording element as defined in claim 9 wherein the photopolymerizable recording layer contains the polymeric binders and the ethylenically unsaturated, photopolymerizable compounds in a weight ratio of from 1:99 to 90:10.

* * * * *